(12) United States Patent
Wang et al.

(10) Patent No.: US 9,362,111 B2
(45) Date of Patent: Jun. 7, 2016

(54) HERMETIC CVD-CAP WITH IMPROVED STEP COVERAGE IN HIGH ASPECT RATIO STRUCTURES

(71) Applicant: Applied Materials, Inc., Santa Clara, CA (US)

(72) Inventors: Zongbin Wang, Singapore (SG); Shalina Deepa Sudheeran, Singapore (SG); Arvind Sundarrajan, San Jose, CA (US); Bharat Bhushan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/609,129

(22) Filed: Jan. 29, 2015

(65) Prior Publication Data

US 2015/0235844 A1     Aug. 20, 2015

Related U.S. Application Data

(60) Provisional application No. 61/941,323, filed on Feb. 18, 2014.

(51) Int. Cl.
| | |
|---|---|
| H01L 21/44 | (2006.01) |
| H01L 21/4763 | (2006.01) |
| H01L 23/48 | (2006.01) |
| H01L 23/52 | (2006.01) |
| H01L 29/40 | (2006.01) |

(Continued)

(52) U.S. Cl.
CPC ........ *H01L 21/02274* (2013.01); *C23C 16/045* (2013.01); *C23C 16/402* (2013.01); *C23C 16/4554* (2013.01); *H01J 37/32357* (2013.01); *H01J 37/32449* (2013.01); *H01J 37/32568* (2013.01); *H01J 37/32577* (2013.01); *H01L 21/0228* (2013.01); *H01L 21/02164* (2013.01); *H01L 21/02205* (2013.01); *H01L 21/02211* (2013.01); *H01L 21/02216* (2013.01); *H01L 21/30625* (2013.01); *H01L 21/76831* (2013.01);

(Continued)

(58) Field of Classification Search
CPC .................. H01L 21/76898; H01L 21/02274; H01L 21/02164; H01L 21/76831
USPC ........................... 438/643, 653, 667; 257/774
See application file for complete search history.

(56) References Cited

U.S. PATENT DOCUMENTS

| | | | |
|---|---|---|---|
| 7,459,405 B2 | 12/2008 | Ingle et al. | |
| 7,825,038 B2 | 11/2010 | Ingle et al. | |

(Continued)

OTHER PUBLICATIONS

International Search Report and Written Opinion for International Application No. PCT/US2015/013539 dated May 26, 2015.

*Primary Examiner* — Karen Kusumakar
(74) *Attorney, Agent, or Firm* — Patterson & Sheridan, LLP

(57) ABSTRACT

Implementations described herein generally relate to methods for forming dielectric films in high aspect ratio features. In one implementation, a method for forming a silicon oxide layer is provided. A silicon-containing precursor gas is flown into a processing chamber having a substrate having a high aspect ratio feature disposed therein. Then a high frequency plasma is applied to the silicon-containing precursor gas to deposit a silicon-containing layer over the surface of the high aspect ratio feature. The processing chamber is purged to remove by-products from the silicon-containing layer deposition process. An oxygen-containing precursor gas is flown into the processing chamber. A high frequency plasma and a low frequency plasma are applied to the oxygen-containing precursor gas to form the silicon oxide layer.

20 Claims, 4 Drawing Sheets

| | | | |
|---|---|---|---|
| (51) | Int. Cl. | | |
| | *H01L 21/02* | (2006.01) | |
| | *H01L 21/768* | (2006.01) | |
| | *H01L 21/306* | (2006.01) | |
| | *C23C 16/04* | (2006.01) | |
| | *C23C 16/40* | (2006.01) | |
| | *C23C 16/455* | (2006.01) | |
| | *H01J 37/32* | (2006.01) | |
| | *H01L 21/3065* | (2006.01) | |
| (52) | U.S. Cl. | | |
| | CPC .... *H01L 21/76834* (2013.01); *H01L 21/76877* (2013.01); *H01L 21/76898* (2013.01); *H01L 21/3065* (2013.01) | | |

(56) References Cited

U.S. PATENT DOCUMENTS

| | | | |
|---|---|---|---|
| 8,101,531 B1 | 1/2012 | Li et al. |
| 8,329,575 B2 | 12/2012 | Rajagopalan et al. |
| 8,647,992 B2 | 2/2014 | Liang et al. |
| 8,664,127 B2 | 3/2014 | Bhatia et al. |
| 8,889,566 B2 | 11/2014 | Chatterjee et al. |
| 2004/0083964 A1 | 5/2004 | Ingle et al. |
| 2005/0064730 A1 | 3/2005 | Ingle et al. |
| 2007/0232082 A1* | 10/2007 | Balseanu .......... H01L 21/02126 438/789 |
| 2008/0067685 A1* | 3/2008 | Eun .................. H01L 21/76837 257/773 |
| 2008/0115726 A1 | 5/2008 | Ingle et al. |
| 2009/0134497 A1* | 5/2009 | Barth ................ H01L 21/76898 257/621 |
| 2012/0028454 A1 | 2/2012 | Swaminathan et al. |
| 2012/0074582 A1 | 3/2012 | Yu et al. |
| 2012/0156872 A1 | 6/2012 | Cao |
| 2013/0102149 A1 | 4/2013 | Sapre et al. |
| 2013/0260555 A1 | 10/2013 | Zope et al. |
| 2013/0337615 A1 | 12/2013 | Xu et al. |

* cited by examiner though the features and functions, and advantages that have been

HERMETIC CVD-CAP WITH IMPROVED STEP COVERAGE IN HIGH ASPECT RATIO STRUCTURES

CROSS-REFERENCE TO RELATED APPLICATIONS

This application claims benefit of U.S. provisional patent application Ser. No. 61/941,323, filed Feb. 18, 2014. The aforementioned related patent application is herein incorporated by reference in its entirety.

BACKGROUND

1. Field

Implementations described herein generally relate to methods and systems for forming dielectric films in high aspect ratio features.

2. Description of the Related Art

Electronic circuits, such as, for example, integrated, display, memory, power, and photovoltaic circuits, are being developed with active and passive features which are ever smaller. Three-dimensional (3D) structures of electronic circuits are formed by vertically stacking a plurality of substrates, which each have features thereon, in a multilayer stacked structure. The features of the different substrates are connected to one another with conventional wire bonds located outside the perimeter edges of the substrates. However, the resultant 3D circuit structures cover larger areas because the wire bonds extend outside the stacked substrates, increasing the circuit size and reducing the areal density of the circuit.

Through-silicon vias (TSV) are being used to electrically connect features of circuits in vertically disposed layers to provide 3D circuit structures having higher areal densities and which are absent side wires. In TSV fabrication, vias are etched in a silicon-containing substrate, such as a silicon wafer or glass panel with a silicon layer, which can already have prefabricated circuits. The etched vias are filled with an electrical conductor, e.g., a metallic conductor comprising a metal such as copper (Cu), silver (Ag), gold (Au), tungsten (W), and solder; or doped semiconductors, e.g., polysilicon. Dielectric layers such as silicon oxide and silicon nitride layers are also typically used to line the walls of the vias before depositing the metallic conductor therein to serve as diffusion barriers, hermetic seals, and other insulating, diffusion barrier or permeation-reducing layers. Multiple substrates are then stacked and vertical electrical connections are formed by the TSVs to connect overlying or underlying features and portions of the resultant three-dimensional circuit. These 3D structures are commonly known as 3D packages, System in Package, or Chip Stack MCM. TSVs allow increased functionality in a smaller areal "footprint" and can also provide faster operating speeds by substantially shortening the electrical paths between the vertically stacked, overlying circuits, as compared with wire bonding methods.

Currently, hermetic cap layers often suffer from low step coverage inside high aspect ratio vias and the film stack inside high aspect ratio vias still suffers from high leakage current and low reliability.

Thus, there remains a need for dielectric deposition methods and systems that can deposit hermetic cap layers with improved step coverage in high aspect ratio features.

SUMMARY

Implementations described herein generally relate to methods and systems for forming dielectric films in high aspect ratio features. In one implementation, a method for forming a silicon oxide liner layer in a feature is provided. A silicon-containing precursor gas is flowed into a processing region having a substrate disposed therein, the substrate has a high aspect ratio feature disposed therein. Then, a high frequency plasma and optionally a low frequency plasma are applied to the silicon-containing precursor gas to deposit a silicon-containing layer over the surface of the high aspect ratio feature. The processing region is subsequently purged to remove by-products from the silicon-containing layer deposition process. After purging, an oxygen-containing precursor is flowed into the processing region. A high frequency plasma and a low frequency plasma are applied to the oxygen containing precursor to form a silicon oxide liner layer.

In another implementation, a method of forming a through-silicon via is provided. A plurality of vias are etched in a silicon plate, the vias each having a sidewall and a bottom wall. A silicon oxide liner layer is formed on the sidewall and the bottom wall of each of the plurality of vias. The silicon oxide layer is formed by flowing a silicon-containing precursor gas into a processing region having the silicon plate disposed therein, wherein the silicon-containing precursor gas comprises a Si—O bond. A high frequency plasma and optionally a low frequency plasma are applied to the silicon-containing precursor gas to energize the silicon-containing precursor and deposit a silicon-containing layer over the surface of the plurality of vias. The processing region is subsequently purged to remove by-products from the silicon-containing layer deposition process. After purging, an oxygen-containing precursor is flowed into the processing region. A high frequency plasma and a low frequency plasma are applied to the oxygen-containing precursor to form the silicon oxide liner layer on the sidewall and the bottom wall of each of the plurality of vias. A metallic conductor is deposited in the plurality of vias.

The features, functions, and advantages that have been discussed can be achieved independently in various implementations or may be combined in yet other implementations, further details of which can be seen with reference to the following description and drawings.

BRIEF DESCRIPTION OF THE DRAWINGS

So that the manner in which the above-recited features of the present disclosure can be understood in detail, a more particular description of the disclosure briefly summarized above may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially used on other implementations without specific recitation.

DETAILED DESCRIPTION

Figure 1:
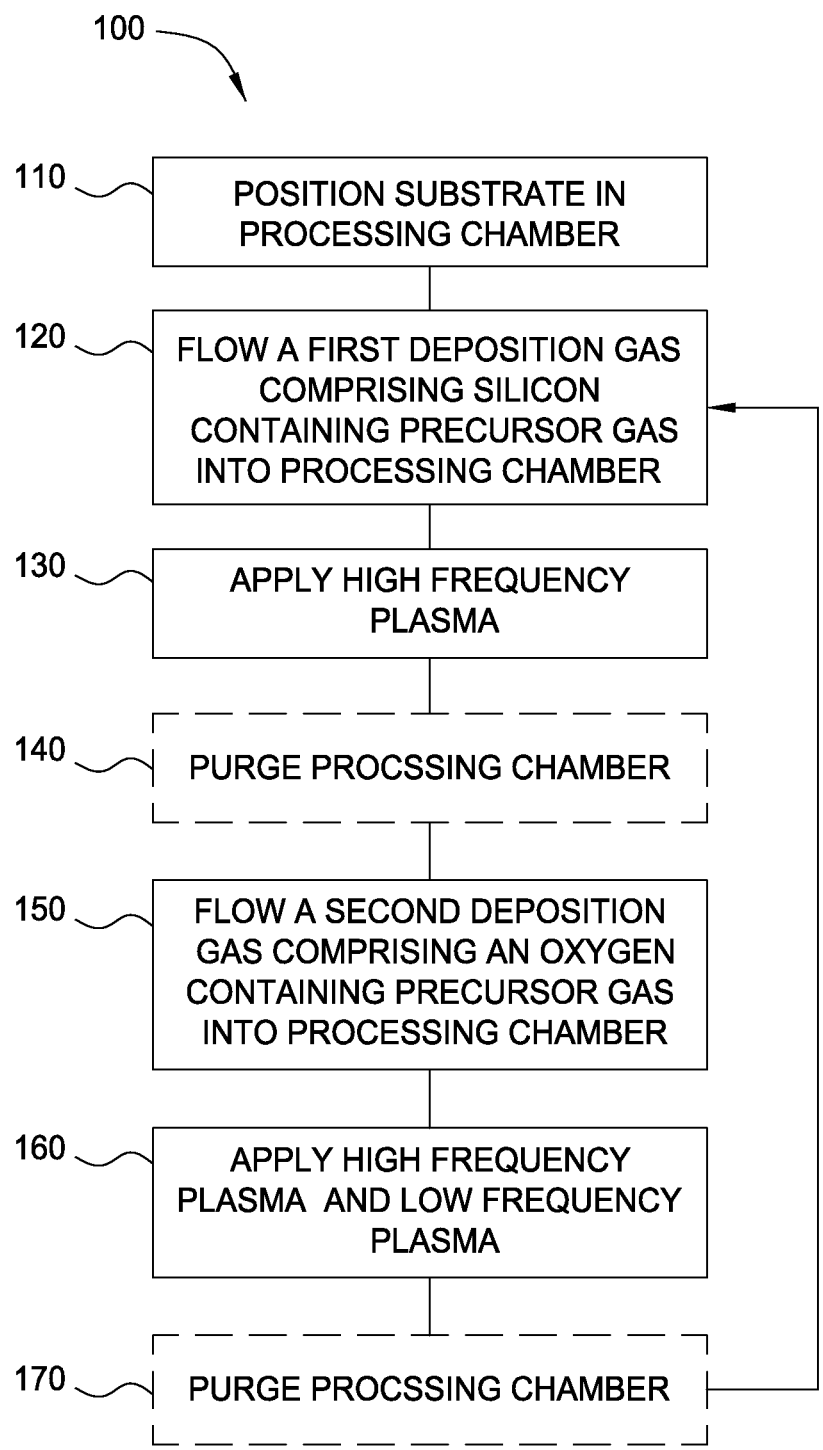
FIG. 1 is a flowchart illustrating a simplified overview of a simplified silicon oxide deposition according to implementations described herein.

The following disclosure describes methods for forming dielectric films in high aspect ratio features and devices for carrying out the aforementioned methods. Certain details are set forth in the following description and in FIGS. 1-4 to provide a thorough understanding of various implementations of the disclosure. Other details describing well-known methods and systems often associated with the formation of dielectric films in high aspect ratio features are not set forth in the following disclosure to avoid unnecessarily obscuring the description of the various implementations.

Many of the details, components and other features described herein are merely illustrative of particular implementations. Accordingly, other implementations can have other details, components, and features without departing from the spirit or scope of the present disclosure. In addition, further implementations of the disclosure can be practiced without several of the details described below.

Implementations described herein generally relate to methods and systems for forming dielectric films in high aspect ratio features. More particularly, the implementations described herein relate to improving the step coverage of high quality silicon oxide liner layers formed in high aspect ratio structures by chemical vapor deposition (CVD) techniques. Previously, tetraethyl orthosilicate (TEOS) and $O_3$ based subatmospheric CVD (SACVD) or atmospheric pressure CVD (APCVD) were used to form silicon oxide liner dielectrics. However, silicon oxide liner films formed using these techniques are susceptible to moisture and often suffer from high leakage current density. One prior attempt to solve these problems involved flowing TEOS in the presence of an $O_2$ based plasma to deposit a $SiO_2$ liner film as a plasma-enhanced CAP (PE Cap) layer using a plasma enhanced chemical vapor deposition (PECVD) process on top of an $SiO_2$ film formed via a SACVD or APCVD process to improve the hermetic properties and electrical performance of the dielectric film. However, the PE Cap layer often suffers from low step coverage inside the via and the film stack inside the via still suffers from high leakage current and low reliability.

In the aforementioned PE Cap process, the TEOS flow, $O_2$ flow and plasma are turned on at the same time and as result, gas phase reaction and surface reaction on the substrate happen concurrently. The molecular species have low surface diffusivity once absorbed onto the surface. Deep inside the via there is much less flux, i.e., lower deposition rate.

In certain implementations described herein, the TEOS flow, $O_2$ flow and plasma are separated. First, the TEOS gas is directed into the chamber for a period of time and then a high frequency (HF) plasma and optionally a low frequency (LF) plasma are switched on to activate the TEOS into sub-molecules, which forms a surface layer on the substrate surface and inside the via. The chamber is then purged with inert gas to remove TEOS inside the chamber ambient. Oxygen is then directed into the chamber for a period of time and both HF plasma and low frequency (LF) plasma are switched on. The HF plasma breaks up $O_2$ to form more reactive oxidants (e.g., $O_2$ mixed with O, $O_3$ and associated ions). It is believed that the low frequency plasma will accelerate oxidants toward the substrate and the surface layer of TEOS reacts with incoming oxidants to form the $SiO_2$ liner film. The new process eliminates gas phase reaction and moves the reaction to the substrate surface. More time is allowed for the species to diffuse into the via, hence providing improved step coverage. Also, by splitting into cycles, more time is provided for exhaustion of by-products which deteriorate the quality of the as-deposited $SiO_2$ liner film.

Implementations described herein may be performed on deposition systems that may include high-density plasma chemical vapor deposition (HDP-CVD) systems, PECVD systems, SACVD systems, APCVD systems, and thermal CVD systems, among other types of systems. Specific examples of CVD systems that may implement the implementations described herein include the CENTURA® ULTIMA HDP-CVD chambers/systems, and PRODUCER® chambers/systems, available from Applied Materials, Inc. of Santa Clara, Calif.

In general, the flowrates of gases to a process chamber will depend on the size of the substrate being processed. Flow rates described herein are typically based on a 300 mm diameter substrate in an appropriately sized chamber.

Figure 4:
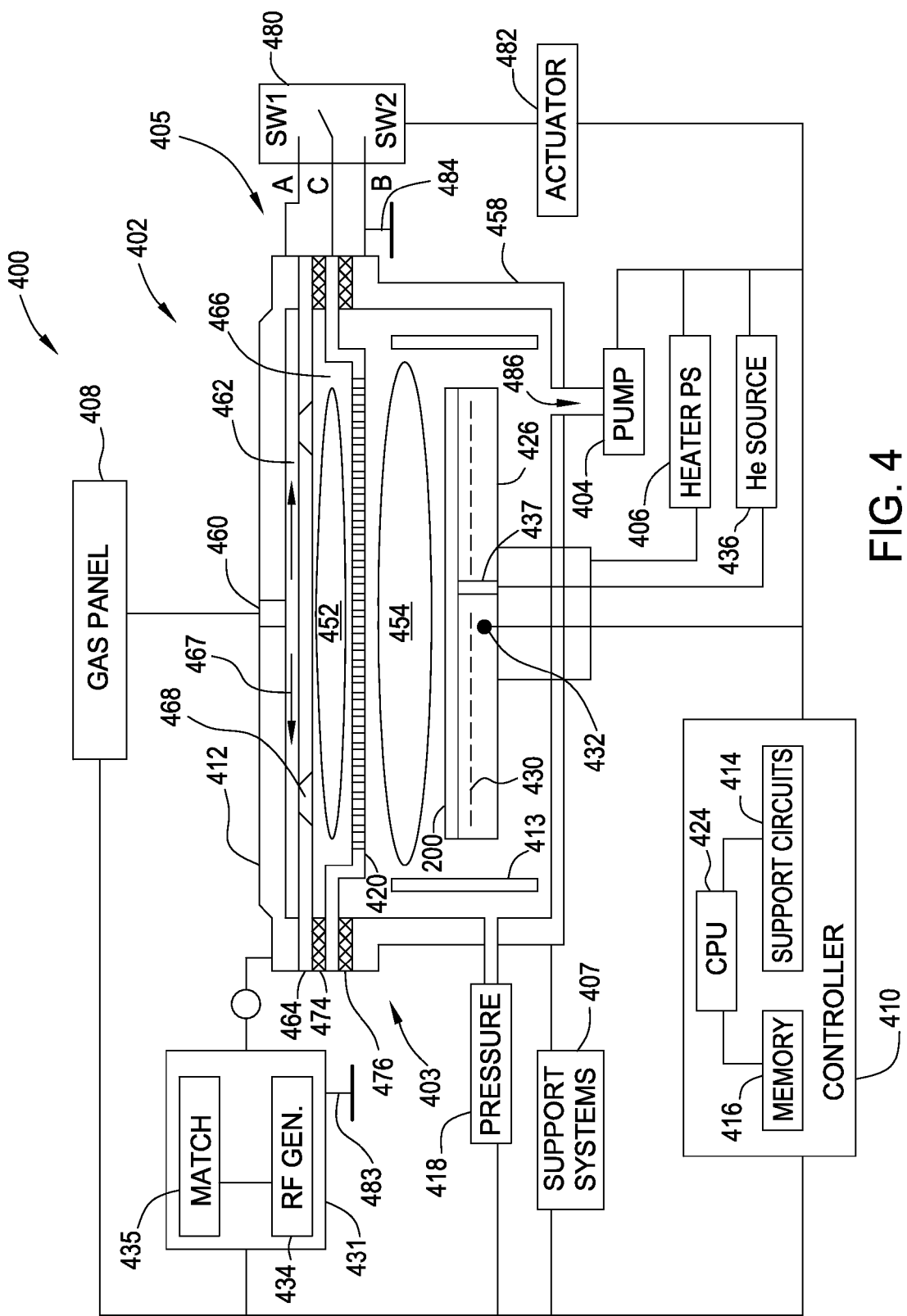
FIG. 4 is schematic cross-sectional view of a substrate processing system that may be used to form silicon oxide films according to implementations describe herein.

FIG. 1 is a flowchart illustrating a simplified overview of a simplified silicon oxide deposition method 100 according to implementations described herein. At process 110 of the method 100, a substrate containing a feature is positioned in a deposition chamber. One exemplary deposition system 400 is depicted in FIG. 4. The substrate may be a semiconductor wafer (e.g., silicon wafer having a diameter of about 300 mm or less; a silicon wafer with a diameter of about 100 mm, 150 mm, 200 mm, 300 mm, 400 mm, etc.) and may include structures, device components, etc., formed in earlier processes. For example, the substrate may include features with high height to width aspect ratios (the ratio of the height of the bare hole divided by the width of the hole) of at least about 5:1 or more (e.g., an aspect ratio of 6:1 or more, 7:1 or more, 8:1 or more, 9:1 or more, 10:1 or more, 11:1 or more, 12:1, 16:7 or more, or even about 10:1 to about 20:1). Exemplary feature definitions include vias, trenches, lines, contact holes, through-holes or other feature definitions utilized in a semiconductor, solar, or other electronic devices, such as high ratio contact plugs.

During the deposition process 120, the substrate may be maintained at a temperature from about 100 degrees Celsius or more (e.g., about 200 degrees Celsius or more, about 400 degrees Celsius or more, about 450 degrees Celsius to about 750 degrees Celsius, about 500 degrees Celsius to about 600 degrees Celsius, or from about 350 degrees Celsius to about 450 degrees Celsius). During the deposition process, the gas pressure in the processing region may be maintained at a pressure from about 2 Torr to about 8 Torr (e.g., about 4.4 Torr). The substrate may be positioned at a spacing from a gas distribution plate of from about 5 mm (approximately 200 mils) to about 20 mm (approximately 800 mils), for example, about 9 mm (approximately 360 mils).

The method 100 includes flowing a first deposition gas comprising a silicon-containing precursor gas into the processing chamber at process 120. The silicon precursor may include an organosilane compound and/or a silicon compound that does not contain carbon. Silicon precursors without carbon may include silane ($SiH_4$), among others. The silicon-containing precursor gas may be an organosilane compound. Organosilane compounds may include compounds with direct Si—C bonding and/or compounds with Si—O—C bonding. Examples of organosilane silicon precursors may include dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethyldimethyldimethoxydisilane, tetramethylcyclotetrasiloxane (TOMCATS), dimethyl dimethoxy silane (DMD-MOS), diethoxymethyl silane (DEMS), methyl triethoxysilane (MTES), triethoxysilane (TES), phenyldimethylsilane, phenylsilane, and combinations thereof. In some implementations, TEOS is used.

The first deposition gas may further comprise a carrier gas. The silicon-containing precursor may be mixed with the carrier gas before or during its introduction to the deposition chamber. A carrier gas may be an inactive gas that does not unduly interfere with the formation of the oxide film on the substrate. Examples of carrier gases include helium, neon, argon, nitrogen ($N_2$), hydrogen ($H_2$), and combinations thereof.

In one implementation, the silicon-containing precursor is transported by a carrier gas such as helium or argon and provided in a mass flow rate of from about 400 mgm (mg/minute) to about 12,000 mgm (e.g., about 800 mgm to about 1,050 mgm; about 1,000 mgm). The first deposition gas may be provided at a flow rate of from about 2000 to about 17,000 sccm (e.g., about 12,000 sccm).

At process 130, the first deposition gas is exposed to high frequency RF plasma to activate the silicon-containing precursor gas into sub-molecules which form a surface layer on the substrate surface and inside the feature. The HF plasma may be formed in-situ in the processing chamber. The high frequency may be between about 100 kHz and about 20 MHz (e.g., 13.56 MHz). The plasma may be maintained by applying a current at a primary frequency of 13.56 MHz to process electrodes at a power level of from about 100 watts to about 1200 watts (e.g., from about 200 watts to about 400 watts; about 350 watts). Process 120 and process 130 may partially overlap in time, may be performed simultaneously or may be performed sequentially.

Optionally at process 130, the first deposition gas may be exposed to both a high frequency RF plasma and a low frequency RF plasma to activate the silicon-containing precursor gas into sub-molecules which form a surface layer on the substrate surface and inside the feature. The plasma may be maintained by applying a current at a primary frequency of 13.56 MHz to process electrodes at a power level of from about 100 watts to about 1200 watts (e.g., from about 200 watts to about 400 watts; about 350 watts). In addition, the plasma can be enhanced by also applying to the process electrodes a low-frequency power at a secondary frequency of up to 400 kHz, e.g., 350 KHz. The secondary power can be applied at a power level of from about 10 watts to about 500 watts (e.g., from about 200 watts to about 400 watts; about 250 watts).

At process 140, the processing chamber may optionally be purged/evacuated to remove by-products generated during the deposition process. The purge gas may be one or more inert gases selected from the group of argon, nitrogen, hydrogen, helium, neon, xenon, and combinations thereof may also be included. The time period of purge gas flow is typically long enough to remove any residual precursor gas after process 120 and 130 and by-products generated during the deposition process from the processing chamber. In some implementations, the purge gas may be the carrier gas used in process 120.

During the purge process 140, the substrate may be maintained at a temperature from about 100 degrees Celsius or more (e.g., about 200 degrees Celsius or more, about 400 degrees Celsius or more, about 450 degrees Celsius to about 750 degrees Celsius, about 500 degrees Celsius to about 600 degrees Celsius, or from about 350 degrees Celsius to about 450 degrees Celsius). In some implementations, the pressure in the processing region during purge process 140 is increased relative to the pressure in the process region during process 120 and process 130. During the purge process 140, the gas pressure in the processing region may be maintained at a pressure from about 100 Torr to about 800 Torr (e.g., from about 400 Torr to about 600 Torr). In some implementations, the spacing of the substrate relative to the gas distribution plate may be decreased relative to the spacing in process 120. During the purge process 140, the substrate may be positioned at a spacing from the gas distribution plate of from about 5 mm (approximately 200 mils) to about 20 mm (approximately 800 mils), for example, about 7.6 mm (approximately 300 mils).

In some implementations, the purge gas is nitrogen. Nitrogen gas may be provided at a flow rate of from about 10,000 to about 30,000 sccm (e.g., from about 25,000 sccm to about 30,000 sccm; about 27,000 sccm). In some implementations, the first purge gas includes multiple purge gases. For example, nitrogen gas may be provided at a flow rate of from about 10,000 to about 30,000 sccm (e.g., from about 25,000 sccm to about 30,000 sccm; about 27,000 sccm) and helium may be provided at a flow rate from about 5,000 sccm to about 15,000 sccm (e.g. from about 10,000 sccm to about 12,000 sccm, about 11,000 sccm).

Alternatively, or in addition to introducing the purge gas, the process chamber may be depressurized in order to remove the residual deposition gases as well as any by-products from the processing chamber. The depressurization process may result in a reduction in the chamber pressure of the processing chamber.

The method 100 further includes flowing a second deposition gas comprising an oxygen-containing precursor gas into the processing chamber at process 150 after the purge process 140. Exemplary oxygen-containing precursors include an oxygen-containing precursor such as molecular oxygen ($O_2$), ozone ($O_3$), a nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen-containing precursors and combinations of precursors. In one implementation, oxygen ($O_2$) is used.

The process conditions for deposition process 150 may be similar or identical to the process conditions for deposition process 120. During the deposition process 150, the substrate may be maintained at a temperature from about 100 degrees Celsius or more (e.g., about 200 degrees Celsius or more, about 400 degrees Celsius or more, about 450 degrees Celsius to about 750 degrees Celsius, about 500 degrees Celsius to about 600 degrees Celsius, or from about 350 degrees Celsius to about 450 degrees Celsius). During deposition process 150, the gas pressure in the processing region may be maintained at a pressure from about 2 Torr to about 8 Torr (e.g., about 4.4 Torr). The substrate may be positioned at a spacing from a gas distribution plate of from about 5 mm (approximately 200 mils) to about 20 mm (approximately 800 mils), for example, about 9 mm (approximately 360 mils).

The oxygen-containing precursor may be provided to the processing region at a flow rate of from about 10,000 to about 30,000 sccm (e.g., from about 25,000 sccm to about 30,000 sccm; about 27,000 sccm).

The second deposition gas may further comprise a carrier gas. The oxygen-containing precursor may be mixed with a carrier gas before or during its introduction to the deposition chamber. A carrier gas may be an inactive gas that does not unduly interfere with the formation of the oxide film on the substrate. Examples of carrier gases include helium, neon, argon, nitrogen ($N_2$), hydrogen ($H_2$), and combinations thereof.

At process 160 a high frequency RF plasma and a low frequency (LF) plasma to the oxygen-containing precursor. The plasma may be maintained by applying a current at a primary frequency of 13.56 MHz to process electrodes at a power level of from about 100 watts to about 1200 watts (e.g., from about 200 watts to about 400 watts; about 350 watts). In addition, the plasma is enhanced by also applying to the process electrodes a low-frequency power at a secondary frequency of up to 400 kHz, e.g., 350 KHz. The secondary power can be applied at a power level of from about 10 watts to about 500 watts (e.g., from about 200 watts to about 400 watts; about 250 watts).

Not to be bound by theory but it is believed that the HF RF plasma disassociates the oxygen-containing precursor gas to more reactive oxidants (e.g., O, $O_3$ and their respective ions). It is also believed that the LF RF plasma accelerates the oxidants toward the substrate. The LF plasma and HF plasma may be formed in-situ in the processing chamber. The already deposited silicon-containing surface layer reacts with the incoming oxidant to form a silicon oxide layer. Process 150 and process 160 may partially overlap in time, may be performed simultaneously or may be performed sequentially.

At process 170, the processing chamber may optionally be purged/evacuated to remove any residual precursor gas after process 150 and 160 and by-products generated during the deposition process. The purge gas may be one or more purge gases selected from the group of argon, nitrogen, hydrogen, helium, neon, xenon, and combinations thereof may also be included. The time period of purge gas flow is typically long enough to remove any residual precursor gas after process 150 and 160 and by-products generated during the deposition process from the processing chamber.

Alternatively, or in addition to introducing the purge gas, the process chamber may be depressurized in order to remove the residual deposition gases as well as any by-products from the processing chamber. The depressurization process may result in a reduction in the chamber pressure of the processing chamber.

Processes 120 through 170 may be repeated until the as deposited silicon oxide layer achieves a desired thickness.

FIGS. 2A-2H are schematic diagrams illustrating a simplified overview of one exemplary method for forming a through-silicon via having an oxide liner formed according to implementations described herein. FIG. 3 is a flowchart illustrating a simplified overview of one exemplary method 300 for forming a through-silicon via according to implementations described herein, for example, the method 300 may be used to form the through-silicon via depicted in FIGS. 2A-2H.

Through-silicon vias (TSVs) are typically fabricated in a substrate 200 comprising a silicon plate 201, using a number of different sequentially performed processes, as shown for example in FIGS. 2A to 2H. The silicon plate 201 is the receptacle for the through-silicon vias and can be, for example: polycrystalline silicon; a silicon wafer composed of monocrystalline silicon; or other forms of crystalline or amorphous silicon. Exemplary through-silicon via fabrication processes are described herein, with an illustrative example being shown in FIG. 3. However, other processes that would be apparent to those of ordinary skill in the art can also be used and all such combinations of processes fall within the scope of the present disclosure. Also, the exemplary processes described herein can be performed in different sequences, substituted with other process steps, or eliminated entirely, without deviating from the scope of the present claims. Thus, the claims should not be limited to the exemplary and illustrative processes and apparatus described herein.

Figure 2A:
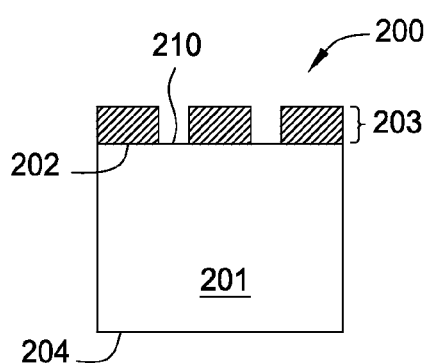
FIGS. 2A-2H are schematic diagrams illustrating a simplified overview of one exemplary method for forming a through-silicon via having an oxide liner formed according to implementations described herein.
Figure 3:
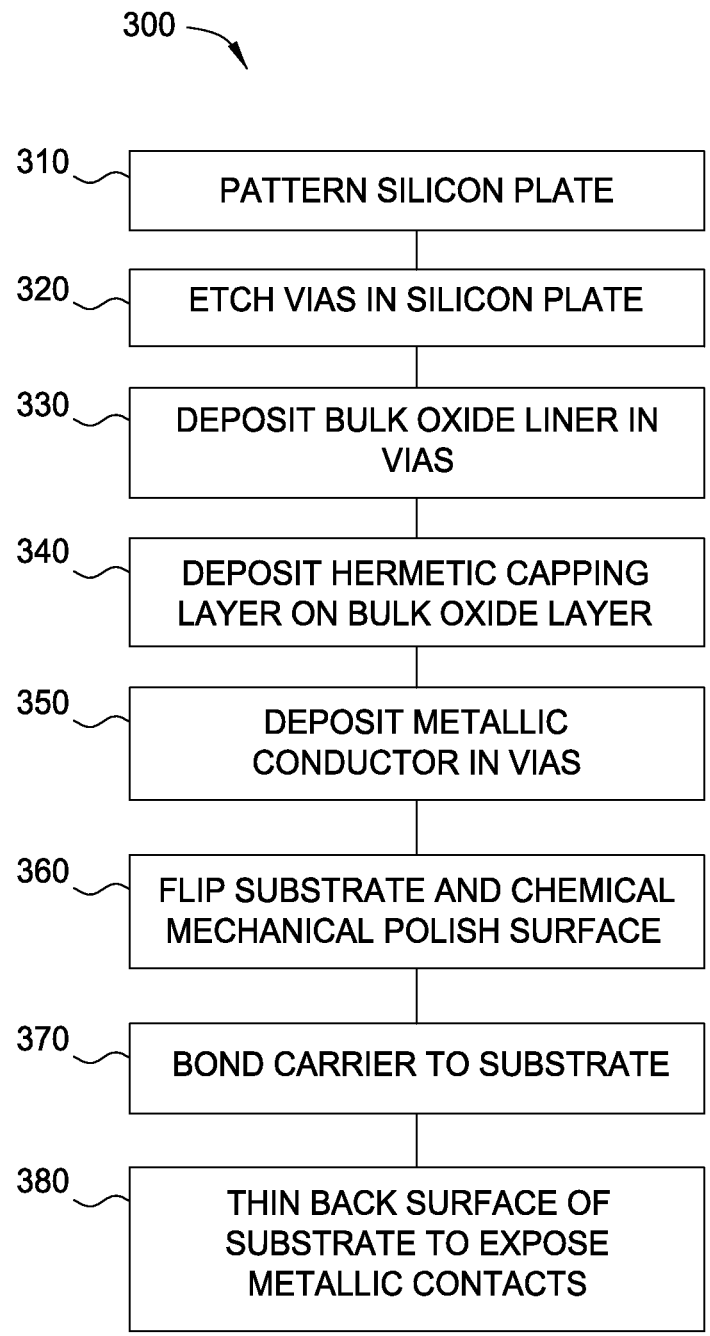
FIG. 3 is a flowchart illustrating a simplified overview of one exemplary method for forming a through-silicon via according to implementations described herein.

In one exemplary implementation, the substrate 200 includes the silicon plate 201 having a front surface 202 with patterned resist features 203 formed thereon, and a back surface 204 as shown in FIG. 2A. The patterned resist features 203 are formed from an etch resistant layer. The etch-resistant layer can be a photoresist layer by itself, or a photoresist layer with a hard mask layer such as a silicon dioxide or silicon nitride layer. The various components of the etch-resistant layer are patterned and developed using conventional lithography processes to form patterned resist features 203 on the front surface 202 of the silicon plate 201, as shown in FIG. 2A and process 310.

Figure 2B:
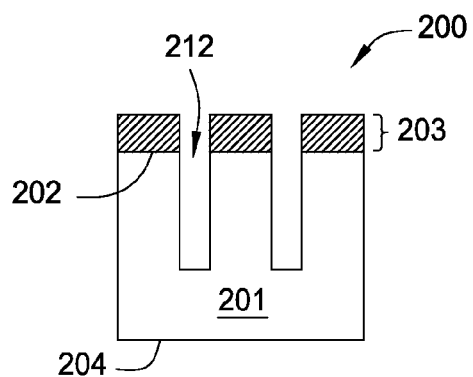
Figure 2C:
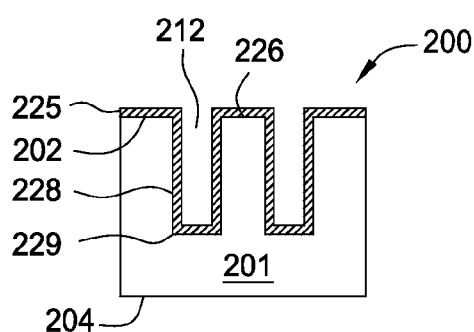

Thereafter, the exposed silicon portions 210 of the silicon plate 201 with the overlying patterned resist features 203 are etched in an etching process as shown in FIG. 2B and process 320. In the etching process, the substrate 200 is placed in the etching zone of an etching chamber, and an etching gas is introduced into the etching zone. In one implementation, the etching gas comprises fluorine-containing gases such as $SF_6$, $CF_4$, $NF_6$, $C_4F_8$, $CHF_3$ and others, and may also optionally include diluent gases such as argon. In one implementation, the exposed silicon portions 210 of the silicon plate 201 are etched away with an etching gas comprising $SF_6$ at a volumetric flow rate of from about 10 to about 4000 sccm, or even, for example, from about 100 to about 1000 sccm. The plasma is sustained by applying a current at a frequency of 400 KHz or 13.56 MHz to process electrodes positioned about the etching zone, at a power level of from about 50 watts to about 2000 watts. During the etching process, the substrate 200 is maintained at temperatures of less than about 80 degrees Celsius, for example, from about 20 degrees Celsius to about 60 degrees Celsius. The substrate 200 is maintained at a spacing from the gas distributor of from about 75 mm (about 3 inches) to about 180 mm (about 7 inches).

The etching plasma etches the exposed silicon portions 210 to form a plurality of vias 212 therein, as shown in FIG. 2B. Generally, the vias 212 are substantially vertical and extend through most of the silicon plate 201, or even the entire thickness of the silicon plate 201. In one implementation, the vias 212 have aspect ratios (the ratio of the height of the bare hole divided by the width of the hole immediately after etching) of at least about 10:1, or even from about 10:1 to about 20:1. In one implementation, the vias 212 have diameters of from about 1 micrometer to about 10 micrometers (e.g., from about 2 micrometers to about 5 micrometers). After the etching process, conventional resist ashing and stripping processes are used to remove the remnants of the patterned resist features 203 on the substrate 200, for example, by using an oxygen-containing plasma to ash the residual resist and other gases, such as halogen gases, to remove any residual hard mask material. The ashing or stripping process can be conducted in the etching chamber or in a different chamber.

A silicon oxide liner layer is formed is formed within the vias 212. The silicon oxide liner layer is a multi-layer structure comprising a bulk oxide layer 225 with a hermetic capping layer 230 formed thereon. The bulk oxide layer 225 may be silicon dioxide, although a nitrogen containing precursor may be used in lieu of or with the oxygen containing precursor to form a nitride layer along with or alternative to the oxide layer. In one implementation, the bulk oxide layer 225 is deposited on the surface 226 of the silicon plate 201 as well as the exposed surfaces of the sidewalls 228 and bottom wall 229 of the vias 212 that were etched into the silicon plate 201, as per process 330 of FIG. 3 and shown in FIG. 2C. The bulk oxide layer 225 may be conformal or substantially conformal as it is grown on the substrate 200. The surface 226 of the silicon plate 201 can be composed of silicon, or can have other layers thereon such as an optional silicon nitride passivation layer (not shown). The bulk oxide layer 225 may be deposited using CVD techniques (e.g., a SACVD or APCVD process).

In process 330, a deposition gas comprising a silicon-containing precursor comprising tetraethylorthosilane (TEOS) and an oxygen precursor comprising oxygen gas ($O_2$), is introduced into a processing region. In one implementation, the TEOS precursor is transported by a carrier gas such as helium and provided in a mass flow rate of from about 400 mgm (mg/minute) to about 12,000 mgm (e.g., about 3000 mgm). The deposition gas is provided at a flow rate of from about 2000 to about 17,000 sccm (e.g., about 12,000 sccm). The gas pressure in the deposition zone may be maintained at a pressure of from about 10 Torr to about 700 Torr (e.g., from about 600 Torr to about 700 Torr). During deposition of the bulk oxide layer 225, the substrate may be maintained at a temperature from about 100 degrees Celsius or more (e.g., about 100 degrees Celsius to about 600 degrees Celsius; about 200 degrees Celsius or more, about 400 degrees Celsius or more, about 450 degrees Celsius to about 750 degrees Celsius, about 500 degrees Celsius to about 600 degrees Celsius, or from about 350 degrees Celsius to about 450 degrees Celsius). The substrate may be positioned at a spacing from a gas distribution plate of from about 5 mm (approximately 200 mils) to about 20 mm (approximately 800 mils), for example, about 9 mm (approximately 360 mils). In one implementation, the bulk oxide layer 225 is deposited to a thickness of from about 30 nanometers to about 4 microns, or even from about 4 microns to about 6 microns.

Figure 2D:
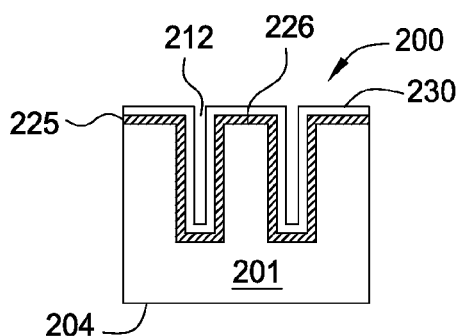

After deposition of the bulk oxide layer 225, a hermetic capping layer 230 of silicon dioxide is deposited on the bulk oxide layer 225 to form the oxide liner layer and seal off the bulk oxide layer 225, as shown in FIG. 2D and process 340. The hermetic capping layer 230 may be silicon dioxide. The hermetic capping layer 230 may be conformal or substantially conformal as it is grown on the bulk oxide layer 225. The hermetic capping layer 230 may be denser than the underlying bulk oxide layer 225, for example having a density of from about 2 $g/cm^3$ to about 3 $g/cm^3$, which is much higher than the density of the bulk oxide layer 225. The hermetic capping layer 230 should also act as an excellent moisture barrier. The hermetic capping layer 230 is made from silicon oxide deposited using method 100 described in FIG. 1.

Optionally, after the oxide liner (bulk oxide layer 225 and hermetic capping layer 230) deposition has occurred, a barrier layer may be optionally formed on the oxide liner. The barrier layer may be formed when certain conductive materials are utilized for the interconnection via fill material, such as copper, to help prevent copper diffusion into the silicon substrate, which can lead to device failure. However, when other fill materials are used (e.g. tungsten or polysilicon) a barrier may not be used. The diffusion barrier may include metals such as tantalum, tantalum nitride, titanium, titanium nitride, nickel, niobium, zirconium, tungsten, or ruthenium, for example, along with other transition metals, or transition metal oxides or nitrides. The diffusion barrier may also prevent metal migration into the substrate. The diffusion barrier may be deposited with CVD, or alternatively with a physical vapor deposition or sputtering, pulsed-laser deposition, or other means of depositing an additional layer of material within the via.

Figure 2E:
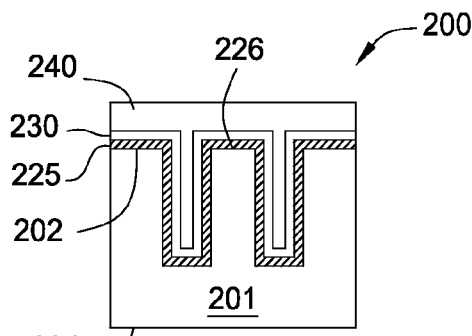

Thereafter, a metallic conductor 240 is deposited into the vias 212 as shown in FIG. 2E and process 350 of FIG. 3. The metallic conductor 240 can include one or more layers of metals, elemental metals or their alloys, metal compounds, or even seed layers. In this process, the metallic conductor 240 is deposited into the vias 212 to fill the vias 212. The metallic conductor 240 can be an elemental metal, metal alloys, metal compound, or mixtures thereof. The metallic conductor 240 is deposited into the vias 212 to fill up the vias with an electrical conductor that serves as interconnects to connect two or more layers of active or passive devices on the present silicon plate 201 with as well as other silicon plates (not shown). Suitable metallic conductors include aluminum, copper, gold, titanium, tungsten, and alloys and compounds thereof.

Figure 2F:
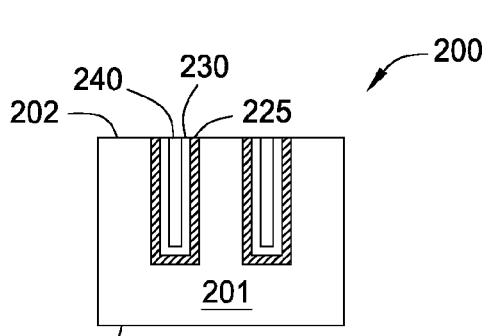

After the metallic conductor 240 is deposited in the vias 212 of the silicon plate 201 to form the TSVs, the substrate 200 is flipped over and the excess metallic conductor 240 on the surface of the silicon plate 201 polished off by a chemical mechanical polishing (CMP) process as per process 360 and as shown in FIG. 2F, to expose the top portions of the metallic conductor 240 deposited into the vias 212 of the silicon plate 201. In a suitable chemical mechanical polishing process, the surface of the silicon plate 201 is polished by a polishing pad mounted on a circulating polisher. A polishing slurry is supplied by a slurry dispenser connected to a polishing slurry source. As the substrate 200 is isolated or rotated relative to the polishing pad, the excess metallic conductor on the surface 226 of the silicon plate 201 is polished off the substrate 200. A suitable polishing slurry comprises a basic particles suspended in an aqueous or alcohol solution. The chemical mechanical polishing step is conducted until all of the metallic conductor 240 on the surface 226 is polished away. The polishing process can also be used to remove any residue of the hermetic capping layer 230, the bulk oxide layer 225, or other such materials which still remain on the surface 226 of the silicon plate 201.

Figure 2G:
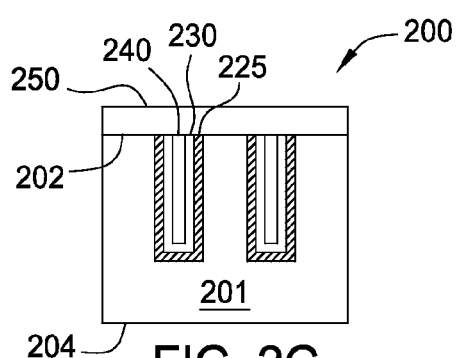

The silicon plate 201 is mounted on a carrier 250 to expose the back surface 204 of the silicon plate 201, as shown in FIG. 2G and process 370 of FIG. 3. The carrier 250 supports the silicon plate 201 during fabrication of the through-silicon vias. A suitable carrier 250 can be, for example, a glass, polymer, ceramic, or semiconductor plate; or can be made from other materials. In one implementation, the carrier 250 is either a silicon wafer or a glass plate.

The front surface 202 of the silicon plate 201 can be bonded to the carrier 250 with an adhesive layer (not shown) therebetween, to expose the back surface 204 of the silicon plate 201 which now becomes the exposed processing surface 204 of the resultant substrate 200. A suitable adhesive layer includes, for example, thermoplastic adhesive, such as a thermoplastic resin that is UV or heat curable. Suitable adhesive layers are manufactured by Brewer Science, Rolla, Mo., or 3M Corp., St. Paul, Minn. Certain thermoplastic resins flow and cure at temperatures of less than 350 degrees Celsius, or even less than 250 degrees Celsius, or even at about 200 degrees Celsius.

Figure 2H:
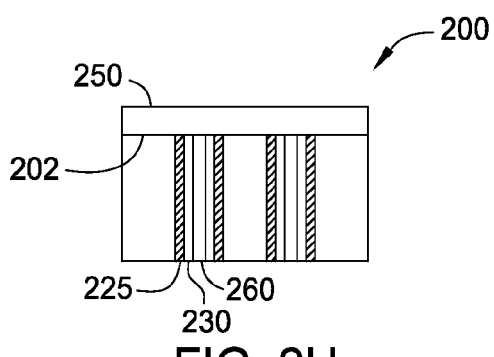

The next process includes the thinning of the back surface 204 of substrate 200 to reveal the TSV as shown in FIG. 2H and process 380 of FIG. 3. As a result, the top portions of the metallic conductor 240 are now exposed to serve as metallic contacts. After polishing, the substrate 200 is flipped over to expose the metallic contacts 260 of the metallic conductor 240 at the top of the vias 212, as shown in FIG. 2H.

The substrate 200 may be subject to further processing depending upon the desired final structure. After the TSV are fabricated, the substrate 200 is debonded to separate the silicon plate 201 from the carrier 250. In a typical debonding process, the final silicon plate 201 is removed from the carrier 250 using a thermo-mechanical activated slide-off technique. This technique uses a compliant chucking system to protect the features and topography formed on the back side of the substrate 200 while heating the substrate 200 to a temperature higher than the softening point of the bonding material. For debonding, the substrate 200 is fixed in an appropriate debonding module on both sides with a compliant vacuum chucking system (not shown) and uniformly heated. When debonding temperature is reached, the silicon plate 201 is slid apart from the carrier 250. The debonding module fully supports both the silicon plate 201 and the carrier 250 over their whole area to keep them flat and stress-free during the debonding procedure. After the silicon plate 201 and carrier 250 are separated, the thin silicon plate 201 with the TSV features on it is transferred to a single-wafer cleaning chamber, where remaining adhesive is removed from the backside of the silicon plate 201 with an appropriate solvent.

Thereafter, the silicon plate 201 is cut using conventional die-cutting methods as per FIG. 3, to separate the individual electronic circuits that are formed on the silicon plate 201, such as integrated circuit chips, displays, solar cells, etc. The die cut electronic circuits are bonded to one another, or to other electronic circuits using conventional bonding methods, such as diffusion bonding to form a multilayer stack comprising a plurality of electronic circuits stacked in a vertical orientation.

FIG. 4 is a schematic cross-sectional view of an exemplary substrate processing system 400 that may be used to form silicon oxide films according to implementations described herein. The system 400 comprises the process chamber 402, a source 431 of radio-frequency (RF) power, a gas panel 408, a source 436 of backside gas, a heater power supply 406, a vacuum pump 404, support systems 407, and a controller 410. In other implementations, the system 400 may comprise at least one optional plasma magnetizing solenoid, an optional source of substrate RF bias, and an optional remote plasma source (all not shown).

The process chamber 402 generally is a vacuum vessel, which comprises a first portion 403 and a second portion 405. In one implementation, the first portion 403 is coupled to the vacuum pump 404 and comprises a substrate pedestal 426, a protective lining 413, and a sidewall 458. The second portion 405 is coupled to the gas panel 408 and comprises a lid 412. The lid 412 further comprises an optional blocking plate 464 and a gas distribution plate (showerhead) 420, which defines a gas mixing plenum 452 and a reaction volume 454.

In one implementation, the lid 412, the blocking plate 464, and the showerhead 420, as well as the sidewall 458, are formed from at least one conductive material, such as metal (e.g., aluminum (Al) and the like) or metal alloy (e.g., stainless steel and the like). Further, the substrate pedestal 426 and the protective lining 413 may be formed from or comprise sub-components that are formed from the at least one of such conductive materials. The referred to components of the process chamber 402 may also comprise portions and/or sub-components formed from non-conductive materials (e.g., ceramic, polyimide, and the like) or from any combination of conductive and non-conductive materials. As such, the scope of the present disclosure is not limited to the process chamber 402 having components formed entirely from conductive materials.

The substrate pedestal 426 is used to support the substrate 200 (e.g., 300 mm silicon (Si) wafer) during a CVD process. In one implementation, the substrate pedestal 426 comprises an embedded resistive heater 430 to heat the substrate pedestal. Alternatively, the substrate pedestal 426 may comprise a source of radiant heat (not shown), such as gas-filled lamps and the like. An embedded temperature sensor 432, e.g., a thermocouple, monitors, in a conventional manner, the temperature of the substrate pedestal 426. The measured temperature is used in a feedback loop to regulate the output of the heater power supply 406 that is coupled to the heater 430 or, alternatively, to the gas-filled lamps.

The support pedestal 426 further comprises a gas supply conduit 437, which may provide gas, e.g., helium, from a source 436 to the backside of the substrate 200 through grooves (not shown) in the support surface of the pedestal. The gas facilitates heat exchange between the support pedestal 426 and the substrate 200. Using the backside gas, the temperature of the substrate 200 may be controlled between about 200 and 800 degrees Celsius.

The gas panel 408 comprises process gases and cleaning gases, as well as equipment for regulating the flow of each gas. In one implementation, a process gas (or gas mixture) or purge gas is delivered from the gas panel 408 into the process chamber 402 through an inlet port 460 disposed in the lid 412. Herein the terms "gas" and "gas mixture" are used interchangeably. The inlet port 460 is fluidly connected to a first plenum 462, where gases may diffuse radially across the optional blocking plate 464, as indicated by arrows 467. Alternatively, the process gas and/or cleaning gas may by delivered into the process chamber 402 through a separate inlet port (not shown) in the lid or showerhead.

The process or purge gas passes through apertures 468 in the blocking plate 464 and enters a second plenum 466 that is formed between the showerhead 420 and the blocking plate 464. The showerhead 420 fluidly connects the second plenum 466 to the reaction volume 454 via a plurality of apertures 468. The showerhead 420 may comprise different zones such that various gases can be released into the reaction volume 454 at various flow rates.

The vacuum pump 404 is adapted to an exhaust port 486 formed in the sidewall 458 of the process chamber 402. The vacuum pump 404 is used to maintain a desired gas pressure in the process chamber 402, as well as evacuate post-processing gases, including reaction by-products, and other volatile compounds (i.e., during a purging process) from the process chamber. In one implementation, the vacuum pump 404 comprises a throttle valve (not shown) to control gas conductance in a path between the pump and the chamber. Gas pressure in the process chamber 402 is monitored by a pressure sensor 418. The measured value is used in a feedback loop to control the gas pressure during processing the substrate 200 or during the purging process.

The source 431 comprises a RF generator 434 and an associated matching network 435. The RF generator 434 may be a mixed frequency RF power generator that typically supplies power at a high RF frequency of 13.56 MHz and at a low RF frequency of 360 KHz to enhance the decomposition of reactive species introduced into the process chamber 402. The RF generator 434 may generally be tuned in a range from about 40 KHz to 20 MHz to produce up to 3000 W. In one implementation, the source 431 (i.e., the RF generator 434 and matching network 435) and the process chamber 402 are coupled to the same ground terminal 484, such as the sidewall 458. The ground terminal 484 may further be electrically coupled (i.e., short-circuited) to a common ground reference of a semiconductor substrate processing system, which encompasses the system 400.

The showerhead 420 and the substrate pedestal 426 together form a pair of spaced apart electrodes. When RF power is applied to either one of such electrodes while the other one is coupled to the ground terminal 484 (e.g., the sidewall 458), gas in the reaction volume 454 is ignited into a plasma. When no RF power is provided to the showerhead 420 and the substrate pedestal 426, the system 400 is configured to perform a CVD process. For example, to perform a PECVD process, the RF power may be applied to the showerhead 420, while the substrate pedestal 426 is coupled to the ground terminal 484. During the PECVD process, a ground reference 483 of the source 431 and the ground terminal 484 of the process chamber 402 (e.g., sidewall 458) are coupled together.

To facilitate the deposition process, the process chamber 402 further comprises a switch 480. A common contact (i.e., contact C) of the switch 480 is coupled to the showerhead 420, while one of selectable contacts (e.g., contact A) is coupled to the lid 412 and the other selectable contact (e.g., contact B) is coupled to the ground terminal 484.

In one implementation, the source 431 applies RF power to the lid 412, while the lid 412 is electrically coupled to the blocking plate 464. In this implementation, the showerhead 420 is electrically isolated within the second portion 405 (i.e., from the blocking plate 464 and lid 412) and from the first portion 403 using, e.g., isolators 474 and 476, respectively. Further, the sidewall 458 and, optionally, the substrate pedestal 426, are electrically coupled to the connected together ground reference 483 and ground terminal 484.

The isolators 474 and 476 may be conventionally formed, e.g., from at least one dielectric material such as alumina ($Al_2O_3$), polyimide, and the like. The isolators 474 and 476 are also formed such that vacuum performance of the process chamber 402 is maintained, e.g., each isolator may be adapted to O-ring or other seal generally used in a vacuumed vessel, such as the process chamber 402, to vacuumize the interior of the vessel.

The switch 480 is generally a double-throw switch. Those skilled in the art will appreciate, that such connections may be performed using, e.g., two single-throw switches and the like. When the switch 480 is set to a first position SW1, the switch provides a short circuit between the lid 412 (contact A) and the showerhead 420 (contact C). Similarly, when the switch 480 is set to a second position SW2, the switch provides a short circuit between the showerhead 420 (contact C) and the ground terminal 484 (contact B). As such, when the sidewall 458 is formed from a conductive material, e.g., aluminum, the second position SW2 also corresponds to a short circuit between the showerhead 420 and the sidewall 458.

For better performance, connections to contacts A, B, and C are provided using conductors (e.g., wires, coaxial cables, and the like) of minimal impedance and length. In one further implementation, the switch 480 may comprise more than one set of contacts such as contacts A, B, and C to enhance the operation of the switch (e.g., reduce contact resistance between contacts C and A in the first position SW1 or between contacts or C and B the a second position SW2).

The switch 480 may be operated manually or, alternatively, by an actuator 482 (e.g., a solenoid, linear motor, and the like), controlled, e.g., by the controller 410. In the depicted implementation, the controller 410, using the actuator 482, may set the switch 480 to the first position SW1, to the second position SW2, or trigger the switch from one such position to another.

When the switch 480 is set to the first position SW1, the process chamber 402 is configured for performing a CVD or PECVD process. During such process, the process gas is supplied into the chamber. When the process chamber 402 performs a CVD process, no RF power is applied to the process chamber 402 (i.e., to the lid 412 and, respectively, to the showerhead 420). As such, during the CVD process, no plasma is developed in the process chamber 402. Alternatively, when the process chamber 402 performs a PECVD process, the source 431 applies RF power to lid 412 (coupled further to the blocking plate 464) and the showerhead 420, and, as such, energizes the process gas to a plasma in the reaction volume 454.

When the switch 480 is set to the second position SW2, the process chamber 402 is configured for performing a cleaning process. During the cleaning process, cleaning gas is delivered into the chamber. When the cleaning process is performed, the source 431 applies RF power to the lid 412 (coupled further to the blocking plate 464), while the showerhead 420 is isolated from the lid and coupled to the ground terminal 484. In this configuration, the lid 412 (together with the blocking plate 464) and the showerhead 420 form a pair of spaced apart electrodes. When the source 431 applies RF power to such electrodes, the processing gas is energized to a plasma in the gas mixing plenum 452, however, no gas is energized to a plasma in the reaction volume 454.

In one alternative implementation (not shown), an isolator may be installed to isolate the lid 412 from the blocking plate 464. In this implementation, the showerhead 420 is electrically coupled to the blocking plate 464, while the isolator 476 isolates the showerhead 420 from the first portion 403. During the PECVD process (i.e., when the switch 480 is set to the first position SW1 and the source 431 applies RF power to the lid 412), the process gas may be energized to a plasma in the reaction volume 454, as discussed above in reference to FIG. 4. During processing (i.e., when the switch 480 is set to the second position SW2), the source 431 may energize the processing gas to a plasma within the first plenum 462 using the blocking plate 464 as the electrode, while no gas is energized to the plasma in the reaction volume 454 or gas mixing plenum 452.

The process chamber 402 also comprises conventional systems for retaining and releasing the substrate 200, detection of an end of a process, internal diagnostics, and the like. Such systems are collectively depicted in FIG. 4 as support systems 407.

The controller 410 comprises a central processing unit (CPU) 424, a memory 416, and a support circuit 414. The CPU 424 may be of any form of a general purpose computer processor that can be used in an industrial setting. The software routines can be stored in the memory 416, such as random access memory, read only memory, floppy or hard disk drive, or other form of digital storage. The support circuit 414 is conventionally coupled to the CPU 424 and may comprise cache, clock circuits, input/output sub-systems, power supplies, and the like.

The software routines, when executed by the CPU 424, transform the CPU into a specific purpose computer (controller) 410 that controls the system 400 such that the processes are performed in accordance with the present disclosure. The software routines may also be stored and/or executed by a second controller (not shown) that is located remotely from the system 400.

While the foregoing is directed to implementations of the present invention, other and further implementations of the invention may be devised without departing from the basic scope thereof, and the scope thereof is determined by the claims that follow.

The invention claimed is:

1. A method for forming a silicon oxide liner layer in a feature, sequentially comprising:
    forming a bulk silicon oxide layer over a high aspect ratio feature formed in a substrate;
    flowing a silicon-containing precursor gas into a processing region having the substrate disposed therein;

applying a high frequency plasma to the silicon-containing precursor gas;
depositing a silicon-containing layer over the surface of the bulk silicon oxide layer;
optionally purging the processing region;
flowing an oxygen-containing precursor gas into the processing chamber;
applying the high frequency plasma and a low frequency plasma to the oxygen-containing precursor gas; and
reacting the energized oxygen-containing precursor gas with the deposited silicon-containing layer to form a silicon oxide capping layer on the bulk silicon oxide layer, wherein the bulk silicon oxide layer and the silicon oxide capping layer are formed using different methods, and wherein the silicon oxide liner layer includes the bulk silicon oxide layer and the silicon oxide capping layer.

2. The method of claim 1, wherein applying the high frequency plasma to the silicon-containing precursor gas further comprises applying a low-frequency plasma to the silicon-containing precursor gas.

3. The method of claim 1, wherein the silicon-containing precursor gas is selected from the group consisting of: dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethyldimethyldimethoxydisilane, tetramethylcyclotetrasiloxane (TOMCATS), dimethyl dimethoxy silane (DMDMOS), diethoxymethyl silane (DEMS), triethoxysilane (TES), methyl triethoxysilane (MTES), phenyldimethylsilane, phenylsilane and combinations thereof.

4. The method of claim 3, wherein the oxygen-containing precursor gas is selected from the group consisting of: molecular oxygen ($O_2$), ozone ($O_3$), NO, $NO_2$, $N_2O$, $H_2O$, $H_2O_2$, CO, $CO_2$ and combinations thereof.

5. The method of claim 1, wherein the applying a high frequency plasma to the silicon-containing precursor gas and applying a high frequency plasma and a low frequency plasma to the oxygen-containing precursor gas are performed in-situ in the processing chamber.

6. The method of claim 1, wherein the silicon-containing precursor gas is TEOS and the oxygen-containing precursor gas is oxygen.

7. The method of claim 1, wherein a thickness of the silicon oxide liner layer is between about 30 nanometers to about 1 micrometer.

8. The method of claim 1, wherein the feature is at least one of: a via, a trench, a line, a contact hole, a through-hole, or combinations thereof.

9. The method of claim 1, further comprising depositing a metallic conductor over the silicon oxide liner layer.

10. The method of claim 1, wherein a temperature of the substrate is between 350 degrees Celsius and 450 degrees Celsius during the process of forming the silicon oxide capping layer in the feature.

11. The method of claim 1, wherein a pressure in the processing region is between 2 Torr and 8 Torr during the process of forming the silicon oxide liner layer in the feature.

12. The method of claim 1, wherein the high frequency plasma is maintained by applying a current at a frequency of about 13.56 MHz at a power level of from about 200 watts to about 400 watts.

13. The method of claim 1, wherein the low frequency plasma is maintained by applying a current at a frequency of about 350 kHz at a power level from about 200 watts to about 400 watts.

14. A method of forming a through-silicon via, comprising:
etching a plurality of vias in a silicon substrate, the vias each having a sidewall and a bottom wall;
forming a silicon oxide liner layer on the sidewall and the bottom wall of each of the plurality of vias by:
forming a bulk silicon oxide layer on the sidewall and the bottom wall of each of the plurality of vias;
flowing a silicon-containing precursor gas into a processing region having the silicon substrate disposed therein, wherein the silicon-containing precursor gas comprises a Si—O bond;
applying a high frequency plasma to the silicon-containing precursor gas;
depositing a silicon-containing layer on the surface of the bulk silicon oxide layer;
optionally purging the processing region;
flowing an oxygen-containing precursor gas into the processing chamber; and
applying a high frequency plasma and a low frequency plasma to the oxygen-containing precursor gas to form the silicon oxide capping layer on the bulk silicon oxide layer, wherein the bulk silicon oxide layer and the silicon oxide capping layer are formed using different methods, and wherein the silicon oxide liner layer includes the bulk silicon oxide layer and the silicon oxide capping layer; and
depositing a metallic conductor over the silicon oxide liner layer.

15. The method of claim 14, wherein the silicon-containing precursor gas is tetraethylorthosilicate (TEOS) and the oxygen-containing precursor gas is oxygen ($O_2$).

16. The method of claim 14, wherein a temperature of the substrate is between 350 degrees Celsius and 450 degrees Celsius during the process of forming the silicon oxide capping layer.

17. The method of claim 14, wherein a pressure in the processing region is between 2 Torr and 8 Torr during the process of forming the silicon oxide capping layer.

18. The method of claim 14, wherein the high frequency plasma is maintained by applying a current at a frequency of about 13.56 MHz at a power level of from about 200 watts to about 400 watts.

19. The method of claim 14, wherein the low frequency plasma is maintained by applying a current at a frequency of about 350 kHz at a power level from about 200 watts to about 400 watts.

20. The method of claim 14, further comprising, after depositing the metallic conductor in the vias, flipping the silicon substrate over and chemical mechanical polishing a back surface of the substrate to expose top portions of the metallic conductor deposited into the vias of the silicon substrate.

* * * * *